(12) United States Patent
Mercer

(10) Patent No.: US 12,323,116 B2
(45) Date of Patent: Jun. 3, 2025

(54) BROADBAND AMPLIFIER WITH DC GAIN ERROR CORRECTION

(71) Applicant: Dialog Semiconductor (UK) Limited, London (GB)

(72) Inventor: Mark Mercer, Phoenix, AZ (US)

(73) Assignee: Dialog Semiconductor (UK) Limited, London (GB)

( * ) Notice: Subject to any disclaimer, the term of this patent is extended or adjusted under 35 U.S.C. 154(b) by 530 days.

(21) Appl. No.: 17/733,336

(22) Filed: Apr. 29, 2022

(65) Prior Publication Data
US 2023/0353106 A1   Nov. 2, 2023

(51) Int. Cl.
*H03F 3/45*   (2006.01)
*G05F 1/575*   (2006.01)

(52) U.S. Cl.
CPC ......... *H03F 3/45269* (2013.01); *G05F 1/575* (2013.01); *H03F 2200/171* (2013.01); *H03F 2200/462* (2013.01)

(58) Field of Classification Search
CPC ............................ H03F 3/45269; G05F 1/575
USPC ....................................................... 330/253
See application file for complete search history.

(56) References Cited

U.S. PATENT DOCUMENTS

| | | | | |
|---|---|---|---|---|
| 2005/0275394 | A1* | 12/2005 | Moraveji | G05F 1/565 323/312 |
| 2012/0086276 | A1* | 4/2012 | Sawyers | H02J 7/34 307/66 |
| 2014/0320098 | A1* | 10/2014 | Izumoto | H02M 3/156 323/282 |
| 2018/0183338 | A1* | 6/2018 | Fukushima | H02M 3/1588 |
| 2019/0384337 | A1* | 12/2019 | Lu | G05F 1/575 |
| 2021/0257978 | A1* | 8/2021 | Nagasato | H03F 3/2171 |
| 2022/0416666 | A1* | 12/2022 | Kawano | H02M 3/1588 |

OTHER PUBLICATIONS

"Demystifying Type II and Type III Compensators Using Op-Amp and OTA for DC/DC Converters," by SW Lee, Texas Instruments, Application Report, SLVA662—Jul. 2014, pp. 1-16.
"Correcting DC Errors in High-speed Amplifier Circuits," by Xavier Ramus, Analog, Technical articles, TI E2E support forums, Feb. 22, 2013, pp. 1-3, found: https://e2e.ti.com/blogs_/b/analogwire/posts/correcting-dc-errors-in-high-speed-amplifier-circuits.
"High Speed Amplifier Techniques, A Designer's Companion for Wideband Circuitry," by Jim Williams, Linear Technology, Application Note 47, Aug. 1991, pp. 1-132.

* cited by examiner

*Primary Examiner* — Patricia T Nguyen
(74) *Attorney, Agent, or Firm* — Saile Ackerman LLC; Stephen B. Ackerman

(57) ABSTRACT

The present document describes an error amplification circuit for a voltage regulator. The error amplification circuit comprises a differential error amplifier having a first input for a feedback signal of the voltage regulator and having a second input for a reference signal, wherein the differential error amplifier is configured to provide an amplifier output current in dependence of the signals at the first input and at the second input. Furthermore the error amplification circuit comprises a current sensing unit configured to sense the amplifier output current to provide a sensed current, a processing unit configured to process the sensed current to provide a processed current, and an adjustment resistor which is arranged in series with the second input of the differential error amplifier and to which the processed current is applied.

14 Claims, 7 Drawing Sheets

BROADBAND AMPLIFIER WITH DC GAIN ERROR CORRECTION

TECHNICAL FIELD

The present document relates to a voltage regulator. In particular, the present document relates to an error amplifier for a voltage regulator.

BACKGROUND

Regulators that use analog control schemes typically make use of an error amplifier and filter combination, also known as a compensator, to provide a relatively high DC gain along with a constant mid-band gain that spans a relatively wide frequency range. Such a compensator may be referred to as a Type-2 compensator, and may be used in conjunction with current mode control for a switch mode power supply (SMPS) to achieve frequency stabilization. A relatively high DC gain is typically needed for regulation accuracy. The magnitude of the mid-band gain and/or the frequency range or the mid-band gain are typically dependent on a dominant pole, a dominant zero and a non-dominant pole.

Current error amplification and compensation circuits are large in size, have insufficient DC gain, and/or have limited frequency range.

SUMMARY

The present document solves these problems and provides a compact error amplification and/or compensator circuit with a relatively high DC gain, with reduced size, and with an extended frequency range of the mid-band gain. As such, the present document is directed at the technical problem of reducing the size of an error amplification and/or compensator circuit, at the technical problem of increasing the DC gain of an error amplification and/or compensator circuit and/or at the technical problem of increasing the frequency range of the mid-band gain of an error amplification and/or compensator circuit.

According to an aspect, an error amplification and/or compensator circuit is described, which may e.g., be used for a voltage regulator. The error amplification circuit comprises a differential error amplifier having a first input for a feedback signal of the voltage regulator and having a second input for a reference signal (in particular for a reference voltage). The differential error amplifier is configured to provide an amplifier output current in dependence of the signals at the first input and at the second input. Furthermore, the error amplification circuit comprises a current sensing unit (e.g., a current mirror) configured to sense the amplifier output current to provide a sensed current. In addition, the error amplification circuit comprises a processing unit (e.g., with a filter unit) configured to process the sensed current to provide a processed current. The error amplification circuit further comprises an adjustment resistor which is arranged in series with the second input of the differential error amplifier and to which the processed current is applied.

According to a further aspect, a regulator configured to regulate an output voltage of the regulator in dependence of a reference voltage is described. The regulator comprises the error amplification circuit which is described in the present document. In particular, the regulator may comprise an output stage configured to provide the output voltage, and a voltage sensing unit configured to derive a feedback signal based on the output voltage. Furthermore, the regulator may comprise an error amplification circuit, wherein the feedback signal is applied to the first input of the differential error amplifier and wherein the reference voltage is provided to the second input of the differential error amplifier.

According to another aspect, a method for providing an output current indicative of the deviation of a feedback signal from a reference signal is described. The method comprises applying the feedback signal to the first input of a differential error amplifier, and providing the reference signal to the second input of the differential error amplifier (e.g., via an adjustment resistor). Furthermore, the method comprises sensing the amplifier output current at the output of the differential error amplifier, to provide a sensed current, and processing the sensed current to provide a processed current. The method further comprises feeding back the processed current to the second input of the differential error amplifier using the adjustment resistor which is arranged in series with the second input of the differential error amplifier.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner

BRIEF DESCRIPTION OF THE DRAWINGS

The invention is explained below in an exemplary manner with reference to the accompanying drawings, wherein.

DESCRIPTION

Figure 1A:
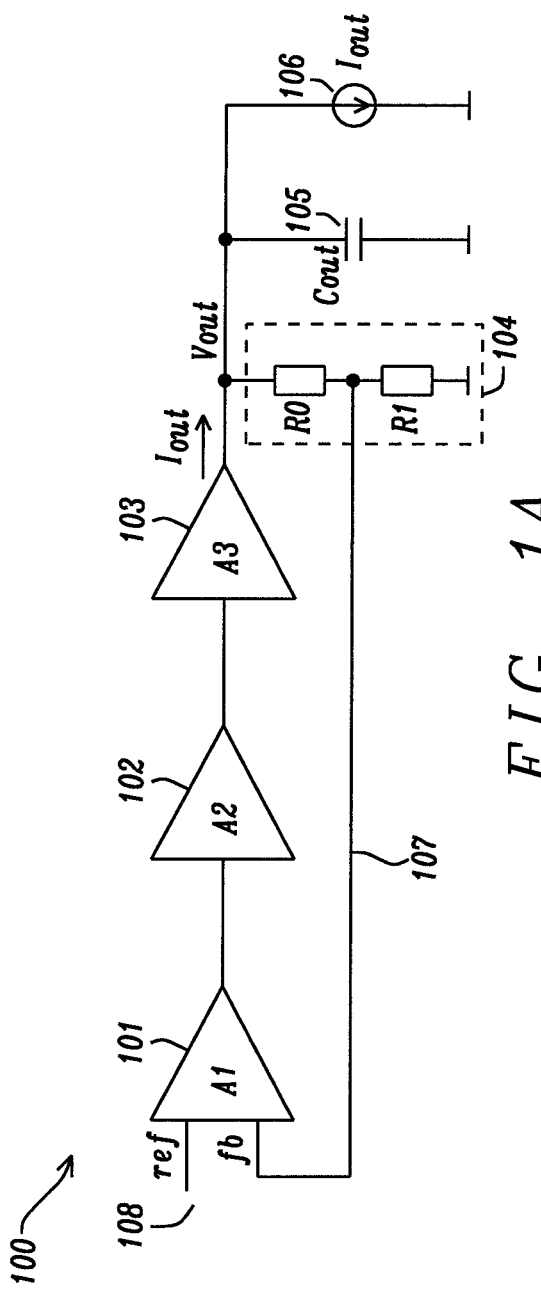
FIG. 1A shows an example voltage regulator.
Figure 4:
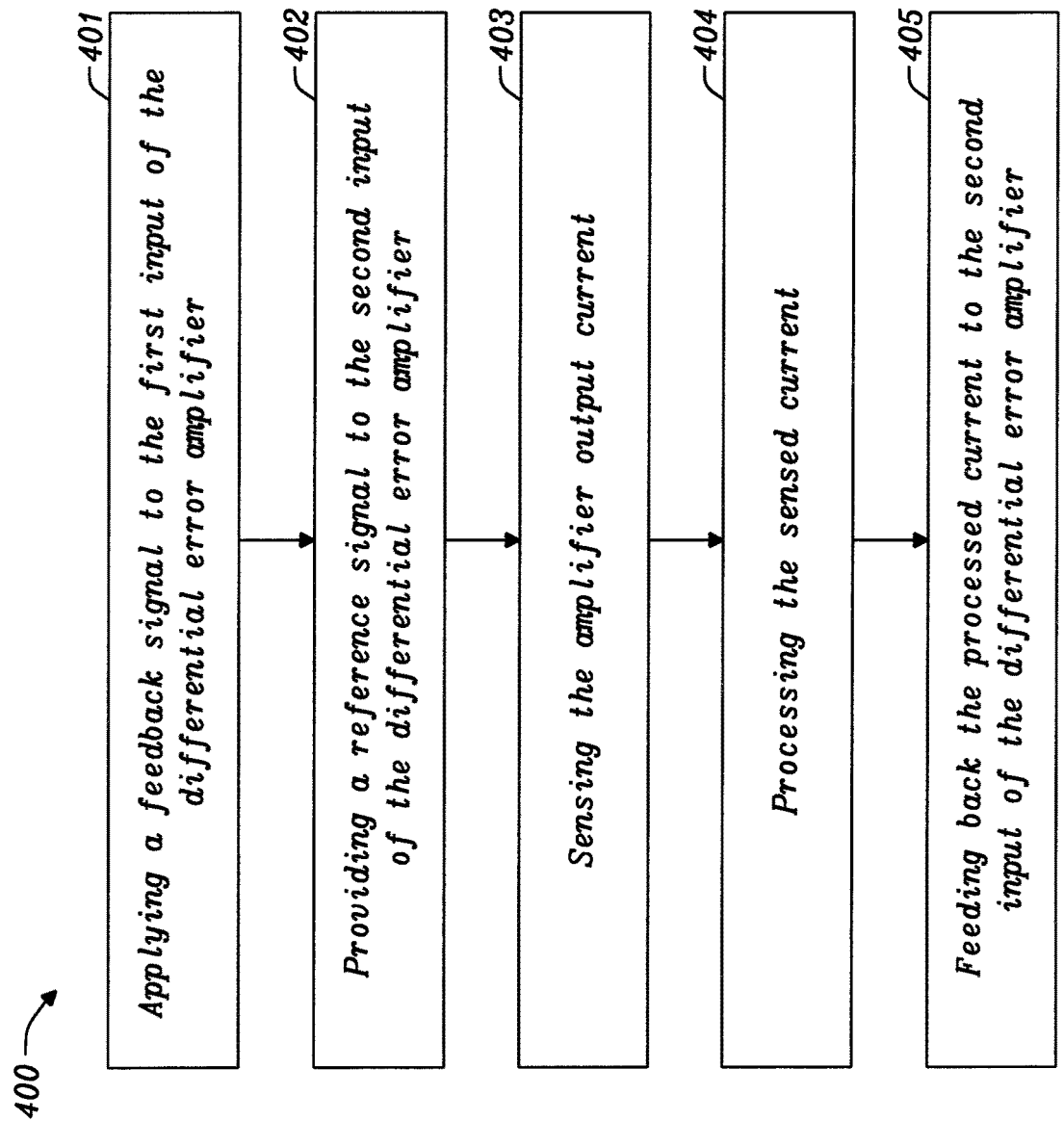
FIG. 4 shows a flow chart of an example method for providing an amplified error signal.

As indicated above, the present document is directed at providing a compact error amplification circuit which exhibits a relatively high DC gain and a relatively wide frequency range of the mid-range gain. The error amplification circuit may be used within a voltage regulator, as shown e.g., in FIG. 1A. FIG. 1A4 illustrates an LDO (low-dropout) regulator 100 as an example for a voltage regulator. The LDO regulator 100 comprises an output amplification stage or output stage 103, comprising e.g., a field-effect transistor (FET) as a pass device, at the output and a differential or first amplification stage 101 (also referred to herein as a differential error amplifier) at the input. A first input (fb) of the differential error amplifier 101 receives a feedback signal 107 which may be a fraction of the output voltage VOUT determined by the voltage divider 104 comprising resistors R0 and R1. The second input (ref) to the differential error amplifier 101 is a voltage reference Vref 108. If the output voltage VOUT changes relative to the reference voltage Vref, the drive voltage to the output amplification stage, e.g., to the pass device, changes by a feedback mechanism referred to as the main feedback loop, to maintain a constant output voltage VOUT.

The LDO regulator 100 of FIG. 1A further comprises an additional intermediate amplification stage 102 configured to amplify the output signal of the differential error amplifier 101. An intermediate amplification stage 102 may be used to provide an additional gain within the amplification path. Furthermore, the intermediate amplification stage 102 may provide a phase inversion.

The LDO regulator 100 is typically used in conjunction with a load capacitor Cout 105 parallel to the load 106. The load capacitor 105 is used to stabilize the output voltage VOUT subject to a change of the load 106, in particular subject to a change of the requested load current or output current Iload/IOUT.

Figure 1B:
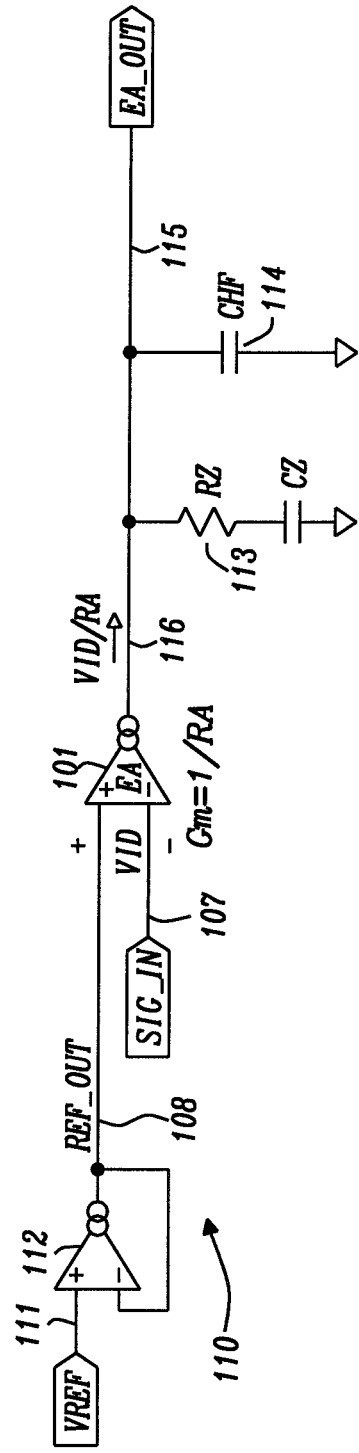
FIG. 1B shows an example error amplification circuit.

FIG. 1B shows an example error amplification circuit 110, in particular a Type-2 compensator circuit, which may be used in the voltage regulator 100 of FIG. 1A. The error amplification circuit or compensator circuit 110 comprises a differential error amplifier 101 (e.g., the error amplifier 101 of FIG. 1A) which receives the feedback signal 107 at the first (possibly inverting) input and the reference voltage 108 at the second input. The difference between the feedback signal 107 and the reference voltage 108 may be referred to as the differential input voltage VID. The reference voltage 108 may be derived from a main reference voltage 111 using a buffer 112.

Hence, the input or feedback signal 107 may be coupled to the inverting input of the error amplifier (EA) 101, and the reference 108 may be connected to the non-inverting input of the EA 101. The differential input voltage (VID) may be converted to an amplifier output current 116 that interacts with a filter network 113, 114 (CZ, RZ and CHF) to provide the output voltage 115 of the error amplification circuit 110. This topology effectively isolates the input of the EA 101 from the output of the EA 101.

The compensator circuit 110 of FIG. 1B may have a limited mid-band frequency range due to the fact that the RA value (which corresponds to the inverse of the transconductance of the EA 101) defines the dominant zero and the non-dominant pole of the transfer function of the compensator circuit 110. In particular, the output resistance of the EA 101 along with CZ may determine the dominant pole. The ratio of RZ to RA may determine the mid-band gain which is typically critical for stability of the compensator circuit 110, because the mid-band gain influences the location of the dominant zero. The dominant zero is typically critical, because it may be positioned to compensate for a pole in the feedback loop (e.g., the pole due to the regulator's load).

Since the position of the dominant zero (defined by RZ and CZ) and/or the mid-band gain (defined by RZ and RA) is typically critical for the overall loop stability, a primary priority of the topology of FIG. 1B may be to select a value for RA, RZ and/or CZ that ensures stability. Consequently, the capacitance CHF 114 is the only variable of the compensator circuit 110 of FIG. 1B, which is available for setting the non-dominant pole (and for defining the width of the frequency range of the mid-band gain). If RA is relatively large, then the capacitance CHF 114 may not be selected to be sufficiently small to achieve a sufficiently broad mid-band gain frequency range (between the dominant zero frequency and the non-dominant pole frequency). The minimum value of CHF 114 is typically limited by the parasitic capacitances in the compensator circuit 110.

Figure 2A:
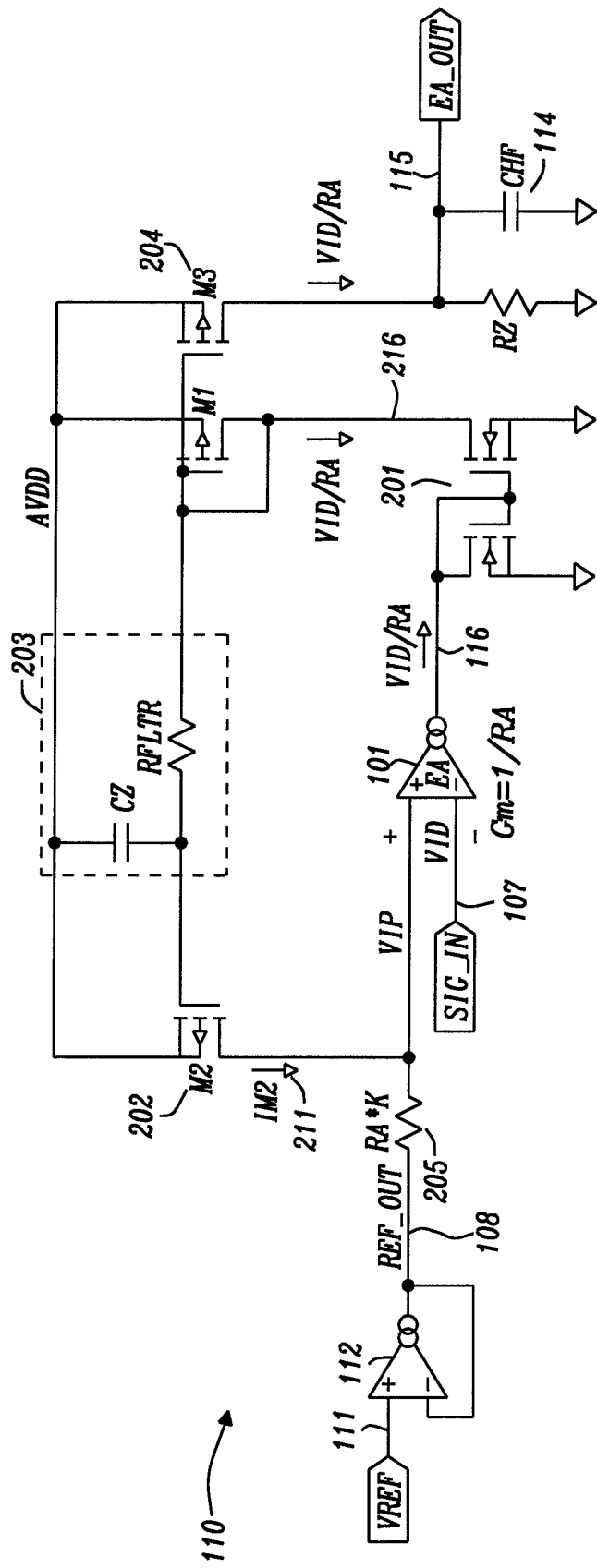
FIG. 2A shows an example error amplification circuit with current feedback.

FIG. 2A shows an example error amplification circuit or compensator circuit 110 which comprises an output current feedback circuit that is configured to generate an adjustment voltage for adjusting the reference voltage 108 at the (second) input of the error amplifier 101 in dependence of the amplifier output current 116 at the output of the error amplifier 101. The current feedback circuit comprises a first current mirror (i.e., a current sensing unit) 201 which is configured to sense the amplifier output current 116. The sensed current 216 is fed back to the (non-inverted) input of the error amplifier 101 using e.g., a second current mirror 202 and/or a filter unit 203, wherein the filter unit 203 may comprise an RC filter.

Furthermore, a third current mirror 204 may be used to provide the sensed current 216 to the output of the error amplifier circuit 110, in particular to the filter network RZ, CHF 114, thereby providing the output voltage 115 of the error amplification circuit 110.

The error amplification circuit 110 further comprises an adjustment resistor 205 which is configured to generate an adjustment voltage (for adjusting the reference voltage 108) based on the feedback current IM2 211.

Hence, the amplifier output current 116 of the EA 101 may be sensed and converted to a voltage via a diode connected FET, M1. The gate-to-source voltage of M1 (i.e., the voltage derived from the sensed voltage 216) may be filtered by the feedback filter unit (RFLTR and CZ) 203. The filtered signal may be the controlling voltage for the output transistor M2 202. The drain current of M2 (IM2) 211 flows into the feedback or adjustment resistor 205 which is arranged between the reference buffer 112 and the non-inverting input of EA 101. The value of the feedback or adjustment resistor 205 may be RA*K, where RA is the inverse of the transconductance of EA 101, and where K is a scaling factor. The voltage across the resistor RA*K 205 may be an adjustment voltage that compensates for the gain error of the EA 101. The uncompensated gain of EA 101 may be RZ/RA. The adjustment voltage VADJ (i.e., the voltage across the resistor 205) may be a controlled positive feedback signal that effectively increases the DC gain of the overall amplifier 110.

Figure 2B:
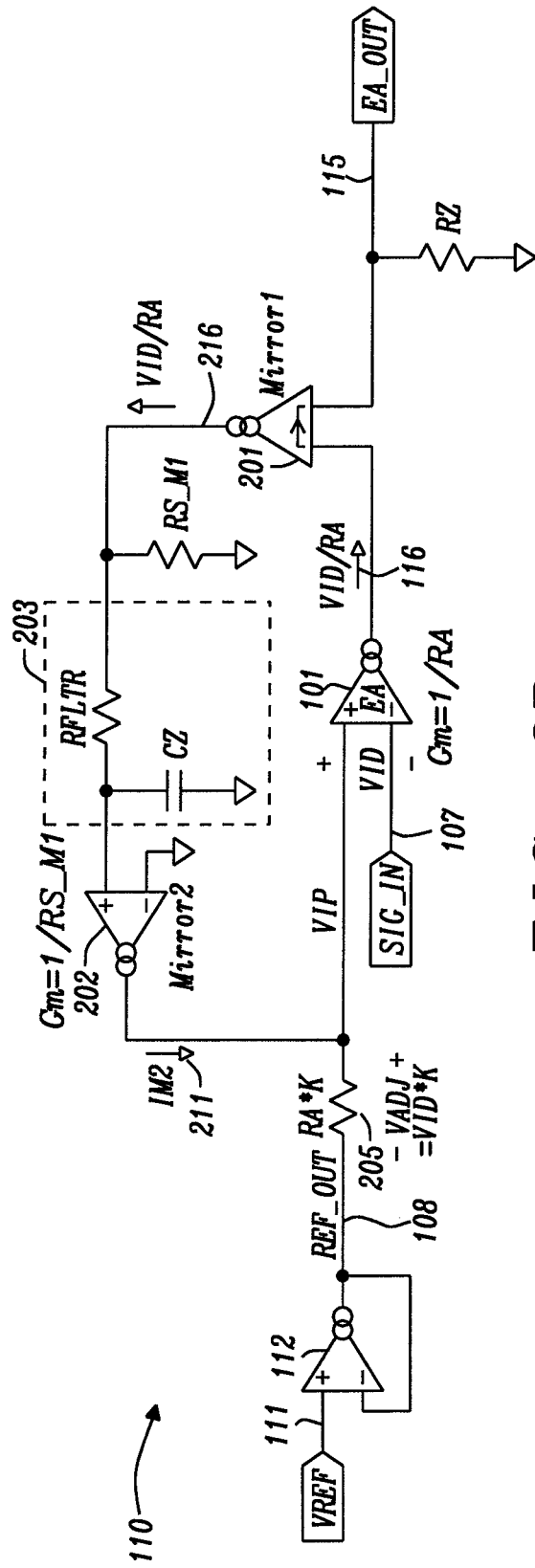
FIG. 2B illustrates an equivalent small-signal model for the error amplification circuit of FIG. 2A.

An equivalent small-signal model of the error amplification circuit 110 of FIG. 2A is shown in FIG. 2B. The overall small-signal transfer function may be written as follows, $$\frac{V_{EA\_OUT}}{V_{REF\_OUT} - V_{SIG\_IN}} = \frac{R_Z}{R_A}\left(\frac{1}{1-K}\right)\left(\frac{1+sC_ZR_{FLTR}}{1+\frac{sC_ZR_{FLTR}}{1-K}}\right)\left(\frac{1}{1+sC_{HF}R_Z}\right)$$

wherein K=1 is the boundary between positive and negative net feedback.

As mentioned previously, K is a feedback resistor scaling factor. If K≥1, then the overall amplifier polarity changes by 180°, thus creating a positive feedback scenario for a voltage regulator 100 such as a SMPS (switch mode power supply). As can be seen from the transfer function, as K→1, the DC gain→∞ and the dominant pole→0. On the other hand, as K→0, the DC gain→RZ/RA and the dominant zero cancels the dominate pole. The separation of the dominant pole and the dominant zero is set by the value of K. The dominant zero is independent of the parameters that determine the DC gain. For a given value of the dominate zero, CZ may be arbitrarily small as long as RFLTR is increased in proportion. In most IC processes (especially deep sub-micron processes), the die area occupied by a relatively large value resistor is substantially less than the area which is occupied by a relatively large capacitor. Therefore, significant die area savings may be achieved with the circuit 110 of FIG. 2A, especially for multi-loop regulators 100 such as a battery charger. In addition, the non-dominate pole is not dependent on the parameters that determine the dominant pole/zero. Therefore, the mid-band gain frequency range may be extended.

It can be shown that using a relatively small capacitance CZ within the feedback filter unit 203 a relatively wide mid-band gain frequency range may be achieved. In other words, the frequency of the dominant zero may be decreased with a relatively small value CZ and without affecting the mid-band gain=RZ/RA. As a result of this, the layout area of the error amplification circuit 110 may be reduced. Furthermore, it may be avoided to add a relatively low frequency non-dominant pole to the loop response of a voltage regulator 100.

Figure 3A:
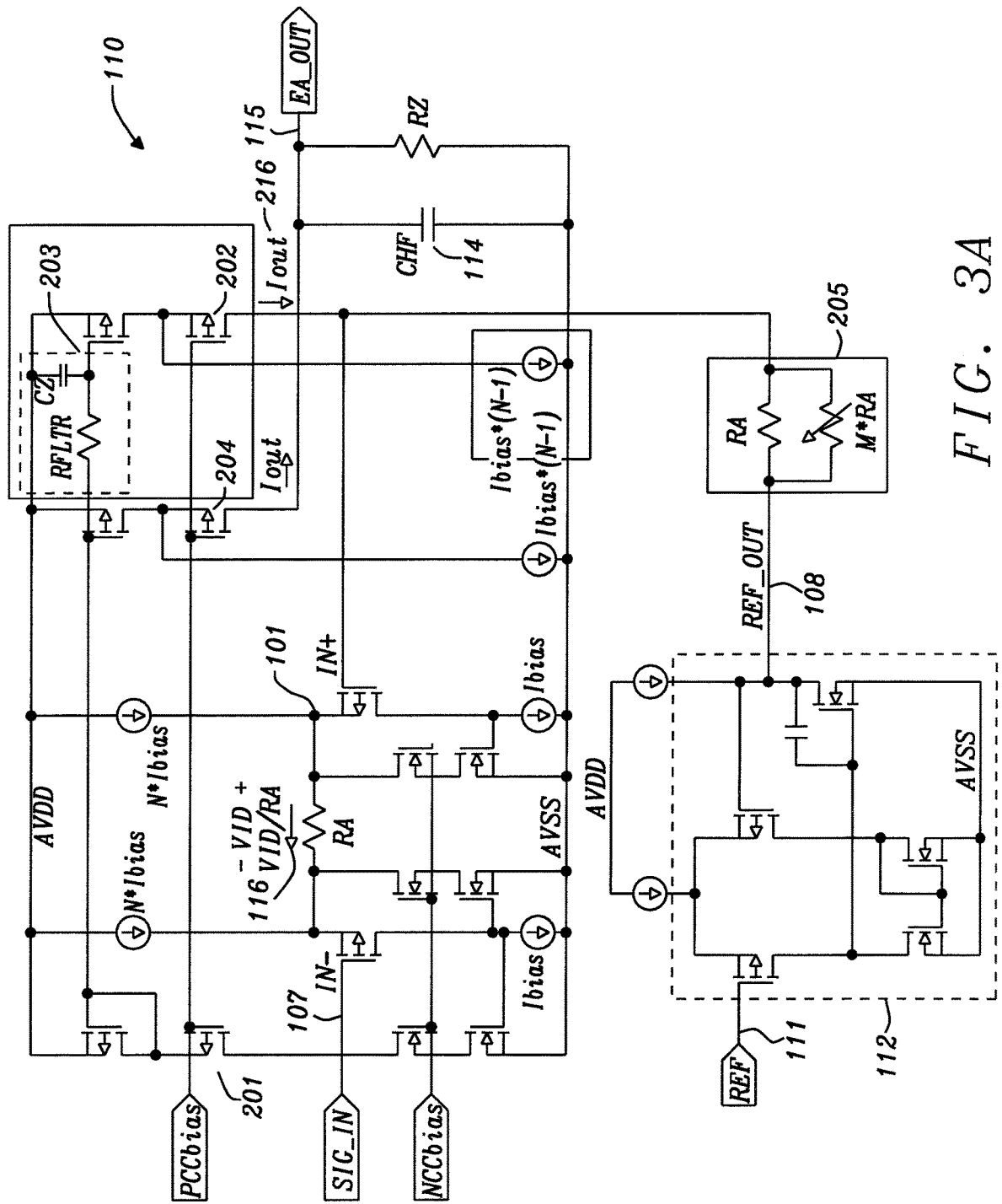
FIG. 3A to 3C show example circuit diagrams of error amplification circuits.
Figure 3B:
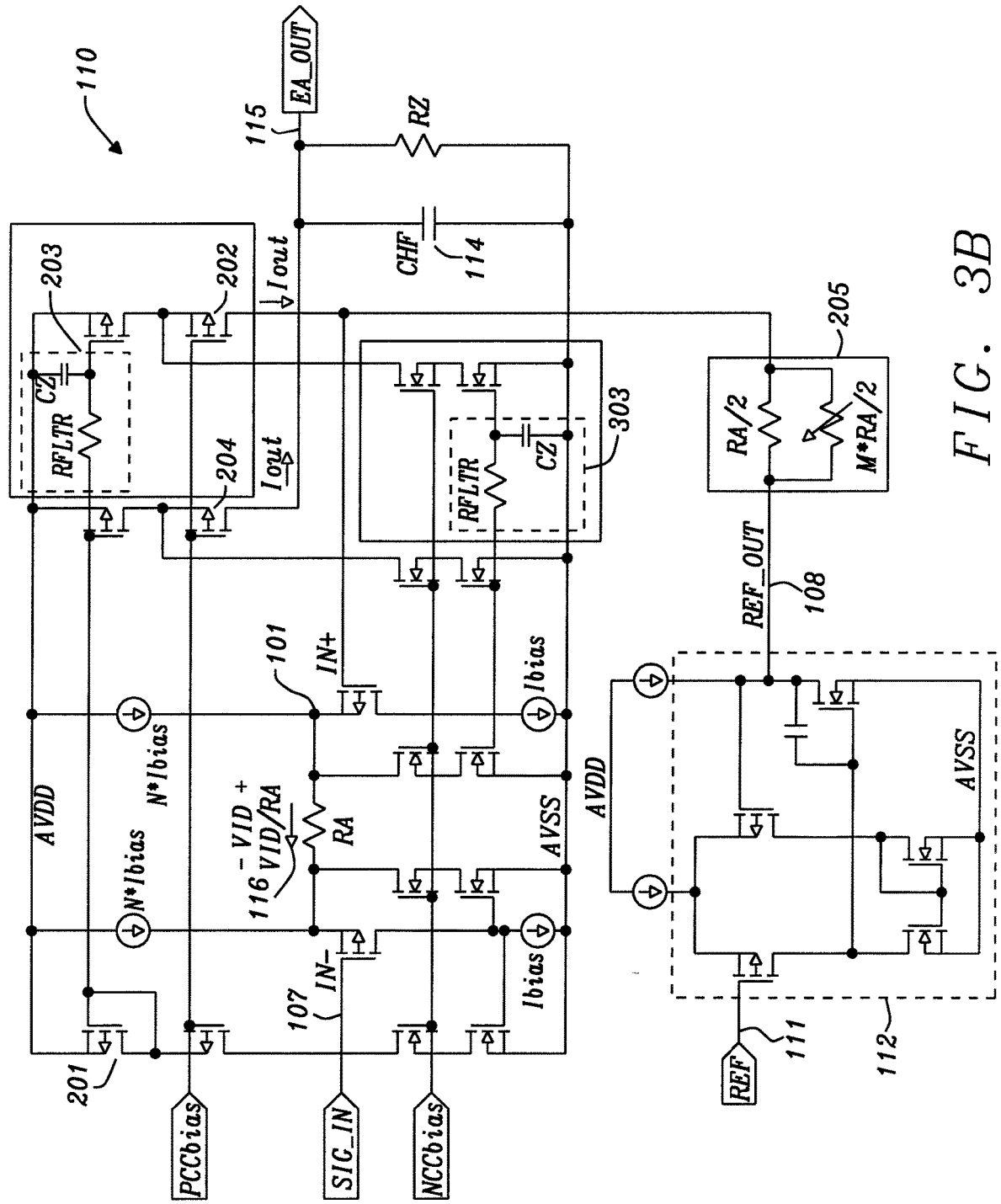
Figure 3C:
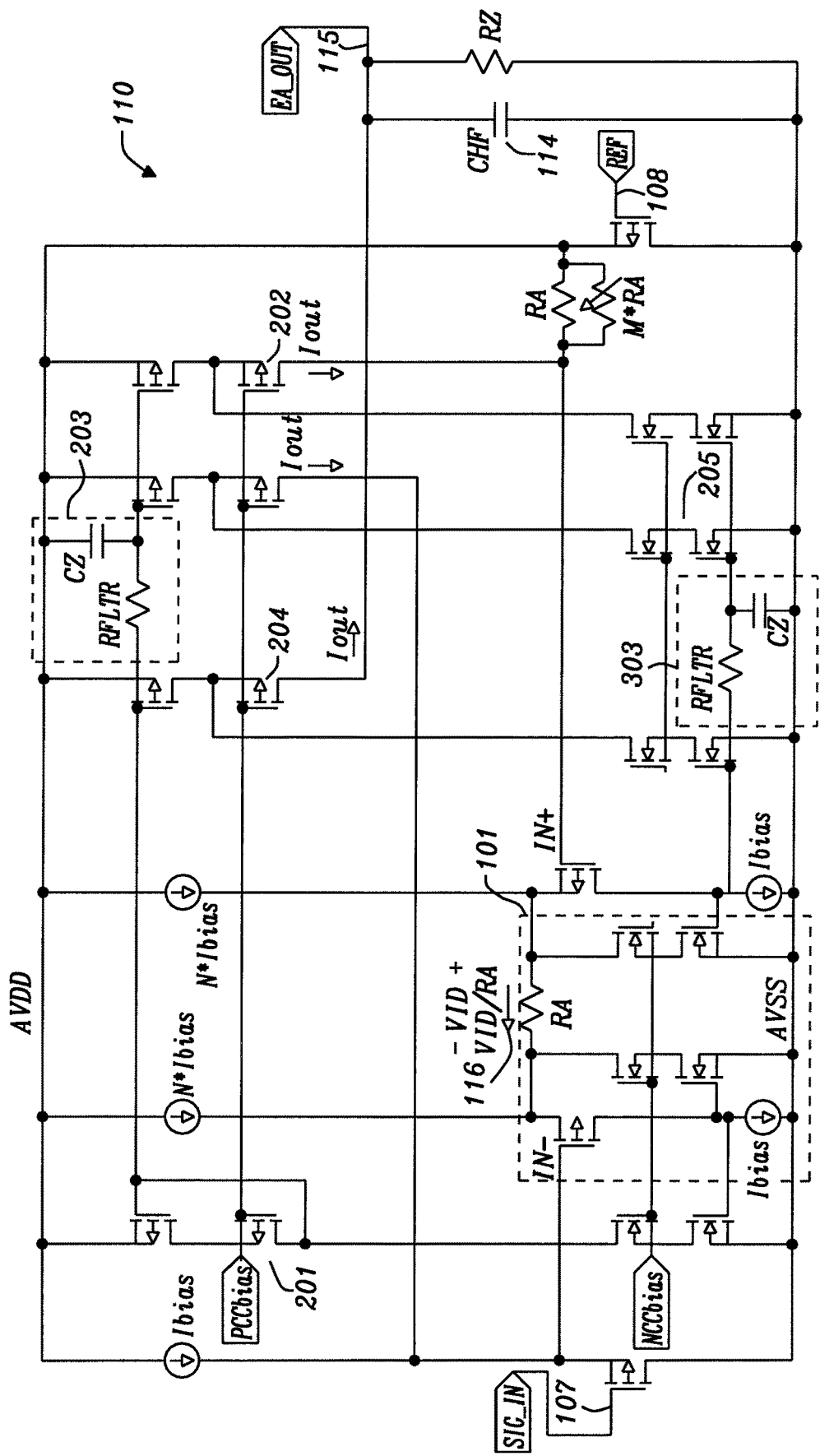

FIGS. 3A to 3C show transistor level implementations of the compensator circuit 110 of FIG. 2A. FIG. 3A shows a wide-swing output OTA (operational transconductance amplifier) 101 with the additional components 203, 205 indicated by the boxes. The components are used to replicate the output current 116 of the OTA 101 (wherein the output current 116 may be VID/RA) and source the replicated or sensed current 216 into the servo resistor 205 in series with the output of the reference buffer 112. The effective transconductance of the OTA in FIG. 3B equals RA/2. The reference buffer 112 is a basic differential amplifier configured for unity closed loop gain. FIG. 3C shows another example, where the servo resistor 205 is incorporated within the OTA 101. The PMOS source follower effectively acts as a buffer 112, so the buffer between the main reference voltage 111 and the servo resistor 205 can be eliminated. The circuits 110 in FIGS. 3B and 3C comprise an additional feedback filter unit 303.

Hence, a compensator and/or error amplification circuit 110 is described which comprises an OTA error amplifier, EA, 101, and which comprises means to sense the output current 116 of the EA 101. The sensed current signal 216 is processed to tailor it's frequency characteristics. Furthermore, the sensed current 216 is converted to a voltage (or possibly to a digital form). A passive, active and/or digital filter 203 may be applied to the converted signal, thereby providing a processed signal, which may be converted back to a current 211. The processed current 211 may be applied to a resistor 205 which is connected in series with the non-inverting input of the EA 101.

The above processing may be performed within a positive feedback path to increase the DC gain of the overall amplifier. The manner in which the EA output current 116 is sensed and processed allows for a significant reduction of the dominant pole capacitor CZ.

FIG. 4 shows a flow chart of an example method 400 for providing an output current 116 indicative of a deviation between a feedback signal 107 and a reference signal 108. The method 400 comprises applying 401 the feedback signal 107 to a first input of a differential error amplifier 101 and providing 402 the reference signal 108 to a second input of the differential error amplifier 101 (via an adjustment resistor 205). In addition, the method 400 comprises sensing 403 an amplifier output current 116 at the (differential) output of the differential error amplifier 101, to provide a sensed current 216, and processing 404 the sensed current 216 to provide a processed current 211. Furthermore, the method 400 comprises feeding back 405 the processed current 211 to the second input of the differential error amplifier 101 using the adjustment resistor 205 which is arranged in series with the second input of the differential error amplifier 101.

Hence, an error amplification and/or (Type-2) compensator circuit 110 is described, which may be used within a voltage regulator 100. The error amplification circuit 110 comprises a differential error amplifier 101 having a first input, to which a feedback signal 107 of the voltage regulator 100 may be applied, and having a second input, to which a reference signal 108, 111, in particular a reference voltage, may be applied (via the adjustment resistor 205 of the error amplification circuit 110). The first input may be the inverting input of the differential error amplifier 101, and the second input may be the non-inverting input of the differential error amplifier 101. The differential error amplifier 101 may comprise or may be an operational transconductance amplifier (OTA).

The differential error amplifier 101 may be configured to provide an amplifier output current 116 (at the output of the differential error amplifier 101) in dependence of the signals 107, 108, 111 at the first input and at the second input, in particular in dependence of the deviation between the signals 107, 108, 111 at the first input and at the second input.

Furthermore, the error amplification circuit 110 comprises a current sensing unit 201 which is configured to sense the amplifier output current 116 to provide a sensed current 216. The current sensing unit 201 may comprise or may be a current mirror.

In addition, the error amplification circuit 110 comprises a processing unit 202, 203, 204 which is configured to process the sensed current 216 to provide a processed current 211. The processing unit 202, 203, 204 may comprise a feedback filter unit 203 which is configured to filter the sensed current 216 or a signal (notably a sensed voltage) derived from the sensed current 216, to provide the processed current 211. The feedback filter unit 203 may be configured to provide a pole and/or a zero of the transfer function of the error amplification circuit 110. Alternatively, or in addition, the feedback filter unit 203 may comprise a feedback capacitor CZ and a feedback resistor RFLTR (forming an RC filter), wherein the capacitance (of C/) and/or the resistance (of RFLTR) may be set to define the pole and/or the zero of the transfer function.

Furthermore, the processing unit 202, 203, 204 may comprise a current-to-voltage conversion unit M1 (e.g., a transistor M1) which is configured to convert the sensed current 216 into a corresponding (sensed) voltage which is filtered by the feedback filter unit 203 to provide a processed voltage. Furthermore, the processing unit 202, 203, 204 may comprise a voltage-to-current conversion unit M2 (e.g., a transistor M2) configured to convert the processed voltage into the processed current 211. The transistors may be field effect transistors (FETs).

The error amplification circuit 110 further comprises an adjustment resistor 205 which is arranged in series with the second input of the differential error amplifier 101 and to which the processed current 211 is applied. The adjustment resistor 205 may be configured to feed back a fraction of the processed current 211 to the second input of the differential error amplifier 101, thereby adjusting the effective reference signal that is applied to the second input. By doing this, the frequency range of the mid-band gain may be increased, and the size of the capacitance for achieving a wide frequency range may be reduced.

The error amplification circuit 110 may comprise a reference node for applying a reference voltage 108. Furthermore, the error amplification circuit 110 may comprise a voltage buffer 112 configured to provide the reference voltage 108 at the reference node. The adjustment resistor 205 may be arranged between the reference node and the second input of the differential error amplifier 101. Furthermore, the processed current 211 may be applied to a feedback node which is located between the adjustment resistor 205 and the second input of the differential error amplifier 101. By doing this, a precise adjustment of the reference voltage 108 in dependence of the processed current 211 may be achieved.

The differential error amplifier 101 may have a transconductance $Gm=1/RA$. In a preferred example, the resistance value of the adjustment resistor 205 is greater than 0 and smaller than RA, thereby enabling a stable and precise operation of the error amplification circuit 110.

The error amplification circuit 110 may comprise a transfer unit 204 which is configured to transfer the amplifier output current 116 as a transferred current to the output of the error amplification circuit 110. The transfer unit 204 may comprise or may be a current mirror.

Furthermore, the error amplification circuit 110 may comprise an output filter unit 114 which is configured to filter the transferred current to provide the output voltage 115 of the error amplification circuit 110. The output filter unit 114 may be configured to provide a (non-dominant) pole of the transfer function of the error amplification circuit 110. Alternatively, or in addition, the output filter unit 114 may comprise an output resistor RZ and an output capacitor CHF (forming an RC filter). The capacitance and/or the resistance may be used to set the (non-dominant) pole of the transfer function. Alternatively, or in addition, the output resistor RZ may be used to set the mid-band gain of the error amplification circuit 110 (the mid-band gain may be RA/RZ). The one or more passive components at the output of the error amplification circuit 110 (notably the output resistor RZ and/or the output capacitor CHF) may be configured to derive the output voltage 115 based on the output current through the transistor M3.

Hence, the error amplification circuit 110 may comprise a feedback filter unit 203 within the processing unit 202, 203, 204 and an output filter unit 114 at the output of the error amplification circuit 110. The feedback filter unit 203 may comprise electronic components CZ, RFLTR for setting a dominant pole and a dominant zero of the transfer function of the error amplification circuit 110. Furthermore, the output filter unit 114 may comprise electronic components RZ, CHF for setting a non-dominant pole of the transfer function of the error amplification circuit 110, in particular for setting a non-dominant pole of the transfer function independently from the dominant pole and the dominant zero of the transfer function of the error amplification circuit 110. The output resistor RZ may be used to set the mid-band gain. The transfer function may correspond to the one given in the present document. As a result of providing different filter units 203, 114, a particularly wide frequency range of the mid-band gain may be achieved in an area-efficient manner.

The error amplification circuit 110 may be used (as a Type-2 compensator) in a regulator 100 that makes use of an analog control scheme. The error amplification circuit 110 has a relatively high DC gain to meet accuracy requirements. Furthermore, the error amplification circuit 110 exhibits an extended frequency range for the mid-band gain. This may be achieved by making the design of the dominant pole/zero and the non-dominant pole independent of each other. In addition, the error amplification circuit 110 allows for a significant reduction of the size of the compensation capacitor CZ.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An error amplification circuit for a voltage regulator; wherein the error amplification circuit comprises
    a differential error amplifier having a first input for a feedback signal of the voltage regulator and having a second input for a reference signal; wherein the differential error amplifier is configured to provide an amplifier output current in dependence of the signals at the first input and at the second input;
    a current sensing unit configured to sense the amplifier output current to provide a sensed current;
    a processing unit configured to process the sensed current to provide a processed current;
    an adjustment resistor which is arranged in series with the second input of the differential error amplifier and to which the processed current is applied; and wherein the first input is the inverting input of the differential error amplifier, and the second input is the non-inverting input of the differential error amplifier.

2. The error amplification circuit according to claim 1, wherein
    the differential error amplifier has a transconductance $Gm=1/RA$; and
    the resistance value of the adjustment resistor is greater than 0 and smaller than RA.

3. The error amplification circuit according to claim 1, wherein
    the error amplification circuit comprises a reference node for applying a reference voltage;
    the adjustment resistor is arranged between the reference node and the second input of the differential error amplifier; and
    the processed current is applied to a feedback node between the adjustment resistor and the second input of the differential error amplifier.

4. The error amplification circuit according to claim 3, wherein the error amplification circuit comprises a voltage buffer configured to provide the reference voltage at the reference node.

5. The error amplification circuit according to claim 1, wherein the processing unit comprises a feedback filter unit configured to filter the sensed current or a signal derived from the sensed current, to provide the processed current.

6. The error amplification circuit according to claim 5, wherein
    the feedback filter unit is configured to provide a pole and/or a zero of the transfer function of the error amplification circuit; and/or
    the feedback filter unit comprises a feedback capacitor and a feedback resistor.

7. The error amplification circuit according to claim 5, wherein the processing unit comprises
a current-to-voltage conversion unit configured to convert the sensed current into a corresponding voltage which is filtered by the feedback filter unit to provide a processed voltage; and
a voltage-to-current conversion unit configured to convert the processed voltage Into the processed current.

8. The error amplification circuit according to claim 1, wherein the error amplification circuit comprises
a transfer unit configured to transfer the amplifier output current as a transferred current to an output of the error amplification circuit; and
an output filter unit configured to filter the transferred current to provide an output voltage of the error amplification circuit.

9. The error amplification circuit according to claim 8, wherein,
the output filter unit is configured to provide a pole of the transfer function of the error amplification circuit; and/or
the output filter unit comprises an output resistor and an output capacitor.

10. The error amplification circuit according to claim 8, wherein the transfer unit and/or the current sensing unit comprise a current mirror.

11. The error amplification circuit according to claim 1, wherein
the error amplification circuit comprises a feedback filter unit within the processing unit and an output filter unit at an output of the error amplification circuit;
the feedback filter unit comprises electronic components for setting a dominant pole and a dominant zero of the transfer function of the error amplification circuit; and
the output filter unit comprises electronic components for setting a non-dominant pole of the transfer function of the error amplification circuit, in particular for setting a non-dominant pole of the transfer function independently from the dominant pole and the dominant zero of the transfer function of the error amplification circuit.

12. The error amplification circuit according to claim 1, wherein the differential error amplifier comprises an operational transconductance amplifier.

13. A regulator configured to regulate an output voltage of the regulator in dependence of a reference voltage; wherein the regulator comprises,
an output stage configured to provide the output voltage;
a voltage sensing unit configured to derive a feedback signal based on the output voltage;
an error amplification circuit according to claim 1, wherein the feedback signal is applied to the first input of the differential error amplifier and wherein the reference voltage is provided to the second input of the differential error amplifier; and
wherein the first input is the inverting Input of the differential error amplifier and the second input is the non-inverting input of the differential error amplifier.

14. A method for providing an output current indicative of a deviation of a feedback signal from a reference signal; wherein the method comprises
applying the feedback signal to a first input of a differential error amplifier;
providing the reference signal to a second input of the differential error amplifier;
sensing an amplifier output current at an output of the differential error amplifier, to provide a sensed current;
processing the sensed current to provide a processed current;
feeding back the processed current to the second input of the differential error amplifier using an adjustment resistor which is arranged in series with the second input of the differential error amplifier; and
wherein the first input is the inverting input of the differential error amplifier, and the second input is the non-inverting input of the differential error amplifier.

* * * * *